(12) United States Patent
Park et al.

(10) Patent No.: US 10,950,180 B2
(45) Date of Patent: Mar. 16, 2021

(54) PIXEL AND ORGANIC LIGHT EMITTING DISPLAY DEVICE HAVING THE SAME

(71) Applicant: Samsung Display Co., Ltd., Yongin-si (KR)

(72) Inventors: Junhyun Park, Suwon-si (KR); Cheol-Gon Lee, Suwon-si (KR); Yang-Hwa Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 8 days.

(21) Appl. No.: 16/272,452

(22) Filed: Feb. 11, 2019

(65) Prior Publication Data

US 2019/0251907 A1 Aug. 15, 2019

(30) Foreign Application Priority Data

Feb. 13, 2018 (KR) ........................ 10-2018-0017475

(51) Int. Cl.
*G09G 3/32* (2016.01)
*G09G 3/3266* (2016.01)
*G09G 3/3233* (2016.01)
*G09G 3/36* (2006.01)
*H01L 27/32* (2006.01)
*G09G 3/3275* (2016.01)

(52) U.S. Cl.
CPC ......... *G09G 3/3266* (2013.01); *G09G 3/3233* (2013.01); *G09G 3/3275* (2013.01); *G09G 3/3688* (2013.01); *G09G 3/3696* (2013.01); *H01L 27/3248* (2013.01); *H01L 27/3265* (2013.01)

(58) Field of Classification Search
None
See application file for complete search history.

(56) References Cited

U.S. PATENT DOCUMENTS

2015/0356921 A1* 12/2015 Lee ...................... G09G 3/3233
345/699
2016/0111477 A1 4/2016 Ho
2018/0226023 A1* 8/2018 Park ..................... G09G 3/3258

* cited by examiner

*Primary Examiner* — Carl Adams
(74) *Attorney, Agent, or Firm* — Lewis Roca Rothgerber Christie LLP (57) ABSTRACT

A display panel includes a plurality of pixels each including a first transistor between a first node and a second node and having a gate electrode to receive the scan signal, a second transistor between the second node and a third node in series with the first transistor and having a gate electrode to receive the initialization control signal, a driving transistor between the first power voltage providing line and the third node and having a gate electrode connected to the first node, a third transistor between the third node and a fourth node and having a gate electrode to receive the emission control signal, an organic light emitting diode, between the fourth node and the second power voltage providing line, a first capacitor between the first power voltage providing line and the first node, and a second capacitor between the second node and one of the data lines.

20 Claims, 8 Drawing Sheets

PIXEL AND ORGANIC LIGHT EMITTING DISPLAY DEVICE HAVING THE SAME

CROSS-REFERENCE TO RELATED APPLICATION

The present application claims priority to and the benefit of Korean Patent Application No. 10-2018-0017475, filed on Feb. 13, 2018 in the Korean Intellectual Property Office (KIPO), the content of which is incorporated herein in its entirety by reference.

BACKGROUND

1. Field

Aspects of some example embodiments relate generally to a pixel and an organic light emitting display device having the same.

2. Description of the Related Art

Flat panel display (FPD) devices are widely used as a display device of electronic devices, because FPD devices are relatively lightweight and thin compared to cathode-ray tube (CRT) display devices. Examples of FPD devices are liquid crystal display (LCD) devices, field emission display (FED) devices, plasma display panel (PDP) devices, and organic light emitting display (OLED) devices. OLED devices have been spotlighted as next-generation display devices because OLED devices have various advantages such as a relatively wide viewing angle, a relatively rapid response speed, a relatively thin thickness, relatively low power consumption, etc.

A pixel of an OLED device emits light based on a corresponding data voltage and includes a driving transistor (e.g., a thin film transistor (TFT)) that controls a driving of the pixel. Further, the pixel of the OLED device may include additional components for compensating a threshold voltage of the driving transistor and initializing an anode electrode of an organic light emitting diode in order to improve a display defect such as luminance unevenness.

The OLED device controlled by a progressive emission method is sequentially driven in a row-by-row basis to emit light. The OLED device controlled by a simultaneous emission method emits light from all pixels simultaneously.

In each pixel, a current leakage path flowing from the driving transistor to the organic light emitting diode may be generated during a data writing period when the OLED is driven in the simultaneous emission method. As a result, display defects (e.g., luminance unevenness, cross-talk, etc.) may be visible.

The above information disclosed in this Background section is only for enhancement of understanding of the background of the invention and therefore it may contain information that does not constitute prior art.

SUMMARY

Aspects of some example embodiments may include a pixel capable of improving display quality by eliminating a current leakage through a driving transistor and emitting light in a progressive emission method.

Aspects of some example embodiments may include an organic light emitting display device capable of improving display quality.

According to an aspect of some example embodiments, an organic light emitting display device may include a display panel including a plurality of pixels, a plurality of scan lines, a plurality of data lines, a first power voltage providing lines, a second power voltage providing lines, a plurality of initialization control lines, an emission control lines and a panel driver configured to provide a scan signal, a data voltage, a first power voltage, a second power voltage, an initialization control signal, and an emission control signal to drive the pixels. Each of the pixels may include a first transistor connected between a first node and a second node and having a gate electrode to receive the scan signal, a second transistor connected between the second node and a third node in series with the first transistor and having a gate electrode to receive the initialization control signal, a driving transistor connected between the first power voltage providing line and the third node and having a gate electrode connected to the first node to control a driving current, a third transistor connected between the third node and a fourth node and having a gate electrode to receive the emission control signal, an organic light emitting diode, connected between the fourth node and the second power voltage providing line, to emit light based on the driving current, a first capacitor connected between the first power voltage providing line and the first node, and a second capacitor connected between the second node and one of the data lines.

In some example embodiments, the display panel may be to be driven in a frame which includes a first initialization period to initialize the second node and the fourth node, a second initialization period after the first initialization period to initialize a gate voltage of the driving transistor, a threshold voltage compensation period after the second initialization period to compensate a threshold voltage of the driving transistor, a writing period after the threshold voltage compensation period to sequentially write data voltages, and an emission period after the writing period in which the pixels are to sequentially emit light.

In some example embodiments, the driving transistor, the first transistor, the second transistor, and the third transistor may be p-channel metal oxide semiconductor (PMOS) transistors.

In some example embodiments, the first power voltage may have one of a first voltage level and a second voltage level less than the first voltage level, and the second power voltage may have a constant voltage level.

In some example embodiments, the first power voltage may have the second voltage level, the initialization control signal may have a turn-on level, and the emission control signal may have a turn-on level in the first initialization period.

In some example embodiments, the first power voltage may have the second voltage level, the scan signal may have a turn-on level, the initialization control signal has a turn-on level, and the emission control signal may have a turn-on level in the second initialization period.

In some example embodiments, the first power voltage may have the first voltage level, the scan signal may have a turn-on level, and the initialization control signal may have a turn-on level in the threshold voltage compensation period.

In some example embodiments, the first power voltage may have the first voltage level, and the scan signal having a turn-on level may be sequentially provided to the scan lines in order of pixel rows in the writing period.

In some example embodiments, the first power voltage may have the first voltage level, and the emission control signal having a turn-on level may be sequentially provided to the emission control lines in order of pixel rows in the emission period.

In some example embodiments, the driving transistor, the first transistor, the second transistor, and the third transistor may be n-channel metal oxide semiconductor (NMOS) transistors.

According to an aspect of some example embodiments, a pixel of an organic light emitting display device may include a first transistor connected between a first node and a second node and having a gate electrode to receive a scan signal, a second transistor connected between the second node and a third node in series with the first transistor and having a gate electrode to receive an initialization control signal, a driving transistor connected between a first power voltage providing line and the third node and having a gate electrode connected to the first node to control a driving current, a third transistor connected between the third node and a fourth node and having a gate electrode to receive an emission control signal, an organic light emitting diode connected between the fourth node and a second power voltage providing line to emit light based on the driving current, a first capacitor connected between the first power voltage providing line and the first node, and a second capacitor connected between the second node and one of data lines.

In some example embodiments, the display panel may be to be driven in a frame which includes a first initialization period to initialize the second node and the fourth node, a second initialization period after the first initialization period to initialize a driving voltage of the driving transistor, a threshold voltage compensation period after the second initialization period to compensate a threshold voltage of the driving transistor, a writing period after the threshold voltage compensation period to sequentially write data voltages, and an emission period after the wiring period in which the pixels are to sequentially emit light.

In some example embodiments, the first power voltage may have one of a first voltage level and a second voltage level less than the first voltage level, and the second power voltage may have a constant voltage level.

In some example embodiments, the first power voltage may have the second voltage level, the initialization control signal may have a turn-on level, and the emission control signal may have a turn-on level in the first initialization period.

In some example embodiments, the first power voltage may have the second voltage level, the scan signal may have a turn-on level, the initialization control signal may have a turn-on level, and the emission control signal may have a turn-on level in the second initialization period.

In some example embodiments, the first power voltage may have the first voltage level, the scan signal may have a turn-on level, and the initialization control signal may have a turn-on level in the threshold voltage compensation period.

In some example embodiments, the first power voltage may have the first voltage level, and the scan signal having a turn-on level may be sequentially provided to the scan lines in order of pixel row in the writing period.

In some example embodiments, the first power voltage may have the first voltage level, and the emission control signal having a turn-on level may be sequentially provided to the emission control lines in order of pixel rows in the emission period.

In some example embodiments, the driving transistor, the first transistor, the second transistor, and the third transistor may be p-channel metal oxide semiconductor (PMOS) transistors.

In some example embodiments, the driving transistor, the first transistor, the second transistor, and the third transistor may be n-channel metal oxide semiconductor (NMOS) transistors.

Therefore, the pixel and the organic light emitting display device according to some example embodiments may include the first and second transistors connected in series so that the initialization of the anode electrode of the organic light emitting diode and the gate electrode of the driving transistor and the compensation of the threshold voltage may be stably performed. Further, the pixel and the organic light emitting display device according to some example embodiments may include the third transistor connected between the driving transistor and the organic light emitting diode and block a path of the leakage current of the driving transistor in the writing period by turning off the second transistor and the third transistor, so that the fluctuation of the anode voltage of the organic light emitting diode may be prevented. Further, the pixel and the organic light emitting display device according to some example embodiments may perform the progressive emission method in the emission period by sequentially turning on the third transistor, so that the fluctuation of the anode voltage of the organic light emitting diode due to the leakage current of the driving transistor. Thus, the display defect such as the luminance unevenness may be prevented or reduced.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Hereinafter, aspects of some example embodiments of the present inventive concept will be explained in more detail with reference to the accompanying drawings.

Figure 1:
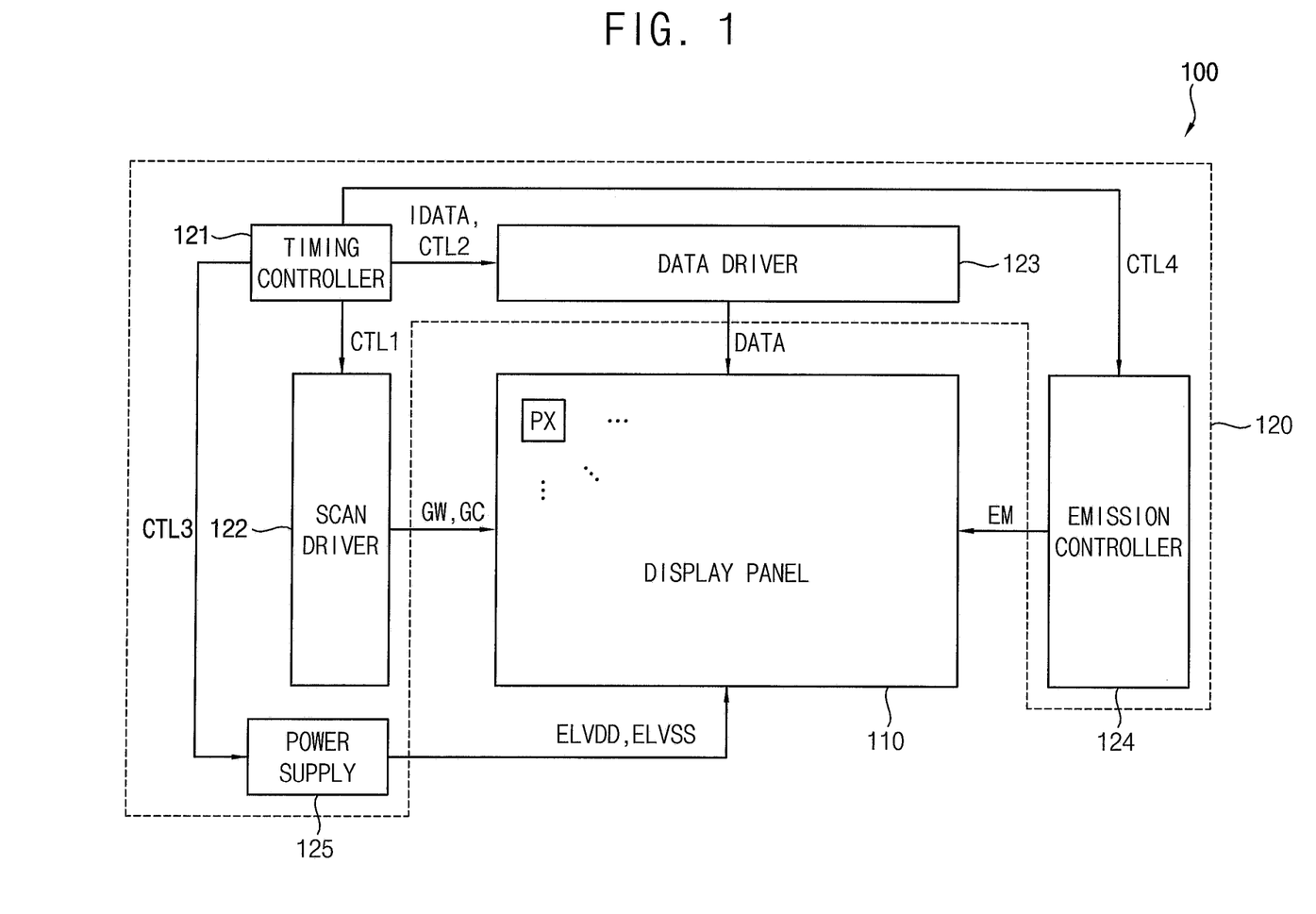
FIG. 1 is a block diagram illustrating an organic light emitting display device according to some example embodiments.
Figure 2:
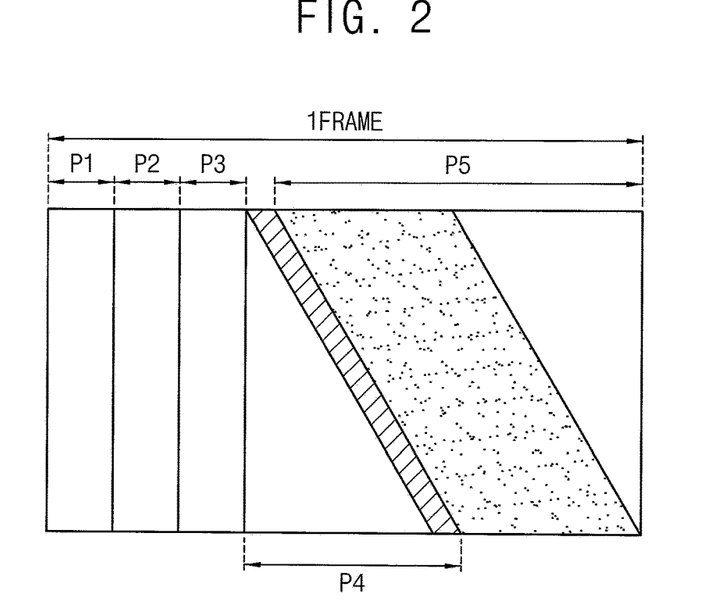
FIG. 2 is a diagram illustrating for describing an operation of the organic light emitting display device of FIG. 1.

FIG. 1 is a block diagram illustrating an organic light emitting display device according to some example embodiments and FIG. 2 is a diagram illustrating for describing an operation of the organic light emitting display device of FIG. 1.

Referring to FIG. 1, an organic light emitting display device 100 may include a display panel 110 and a panel driver 120.

The display panel 110 may include a plurality of pixels PX, a plurality of scan lines, a plurality of data liens, a plurality of first power voltage providing lines, a plurality of second power voltage providing lines, a plurality of initialization control lines, and a plurality of emission control lines.

Each of the pixels PX (illustrated in more detail in FIG. 3) may include a first transistor connected between a first node and a second node and having a gate electrode to receive a scan signal GW, a second transistor connected between the second node and a third node in series with the first transistor and having a gate electrode to receive an initialization control signal GC, a driving transistor connected between a first power voltage providing line and the third node and having a gate electrode connected to the first node to control a driving current, a third transistor connected between the third node and a fourth node and having a gate electrode to receive an emission control signal EM, an organic light emitting diode connected between the fourth node and a second power voltage providing line to emit light based on the driving current, a first capacitor connected between the first power voltage providing line and the first node, and a second capacitor connected between the second node and the data line.

In some example embodiments, the organic light emitting display device 100 may driven based on a frame which include a first initialization period P1 to initialize the second node and the fourth node, a second initialization period P2 to initialize a gate voltage of the driving transistor, a threshold voltage compensation period P3 to compensate a threshold voltage of the driving transistor, a writing period P4 to sequentially write data voltages, and an emission period P5 in which the pixels PX sequentially emit light.

Referring to FIG. 2, the pixel PX of the organic light emitting display device 100 may simultaneously (or concurrently) initialize an anode electrode of the organic light emitting diodes during the first initialization period P1, simultaneously (or concurrently) initialize the gate voltage of the driving transistor during the second initialization period P2, and simultaneously (or concurrently) initialize the threshold voltage of the driving transistor during the threshold voltage compensation period P3. Further, the organic light emitting display device 100 may sequentially write the data voltage DATA in order of pixel rows in the writing period P4 and sequentially emit light the pixels PX in order of the pixel rows in the emission period P5. Times from the threshold voltage compensation period P3 to the writing period P4 may be different by the pixel rows because the data voltage DATA is sequentially provided to the pixels rows during the writing period P4. The pixel PX of the organic light emitting display device 100 according to some example embodiments may prevent or reduce instances of a leakage current flowing from the driving transistor to the organic light emitting diode during the writing period P4 by electrically separating the gate electrode of the driving transistor and an anode electrode of the organic light emitting diode. Further, the pixel PX of the organic light emitting display device 100 according to some example embodiments may prevent or reduce instances of a change of the data voltage DATA from the writing period P4 to the emission period P5 by performing a progressive emission method that sequentially emits pixels PX in a row-by-row with the third transistor connected between the driving transistor and the organic light emitting diode.

The panel driver 120 may drive the scan lines, the data lines, the initialization control lines, and the emission control lines coupled to the display panel 110, and provide a first power voltage ELVDD and a second power voltage ELVSS to the display panel 110. The panel driver 120 may include a timing controller 121, a scan driver 122, a data driver 123, an emission controller 124, and a power supply 125.

The timing controller 121 may control the scan driver 122, the data driver 123, the emission controller 124, and the power supply 125. The timing controller 121 may provide a first control signal CTL1, a second control signal CTL2, a third control signal CTL3, and a fourth control signal CTL4 to each of the scan driver 122, the data driver 123, the emission controller 124, and the power supply 125. In some example embodiments, the timing controller 121 may receive a RGB image signal, a vertical synchronization signal, a horizontal synchronization signal, a main clock signal, and a data enable signal from an external device (e.g., a graph controller) and may generate the first through fourth control signals CTL1, CTL2, CTL3, and CTL4 and an image signal IDATA corresponding to the RGB image signal based on the signals provided from the external device.

The scan driver 122 may provide the scan signal GW and an initialization control signal GC to the scan liens based on the first control signal CTL1. In some example embodiments, the scan driver 122 may simultaneously output the scan signal GW having a turn-on level to the scan lines during the second initialization period P2 and the threshold voltage compensation period P3. Here, the turn-on level is a voltage level of the scan signal GW to turn on the transistor to which the scan signal GW is applied. In some example embodiments, in case that the transistor to which the scan signal GW is applied is a p-channel metal oxide semiconductor (PMOS) transistor, the turn-on level may have a low level. In other example embodiments, in case that the transistor to which the scan signal GW is applied in an n-channel metal oxide semiconductor (NMOS) transistor, the turn-on level may have a high level. Accordingly, the gate voltage of the driving transistor of all the pixels PX may be initialized to a certain voltage level and the threshold voltage of the driving transistor may be compensated. In some example embodiments, the scan driver 122 may sequentially provide the scan signal GW having the turn-on level to the scan lines corresponding to the pixel rows during the writing period P4.

In some example embodiments, the scan driver 122 may simultaneously (or concurrently) output the initialization control signal GC having a turn-on level to the initialization control lines during the first initialization period P1, the second initialization period P2, and the threshold voltage compensation period P3. Here, the turn-on level is a voltage level of the initialization control signal GC to turn on the transistor to which the initialization control signal GC is applied. Accordingly, the anode electrode of the organic light emitting diode of and the gate voltage of the driving transistor of all the pixels PX may be initialized to a certain voltage level and the threshold voltage of the driving transistor may be compensated.

Although the scan driver 122 which generates the scan signal GW and the initialization control signal GC is described in FIG. 1, the scan driver 122 of the organic light emitting display device 100 is not limited thereto. For example, the organic light emitting display device 100 may further include an initialization driver that generates the initialization control signal GC.

The data driver 123 may generate the data voltage DATA based on the second control signal CTL2 and the image data IDATA received from the timing controller 121. The data driver 123 may provide the data voltage DATA to the pixels PX through the data liens during the writing period P4.

The emission controller 124 may provide the emission control signal EM to the emission control lines based on the third control signal CTL3. In some example embodiments, the emission controller 125 may simultaneously (or concurrently) output the emission control signal EM having a turn-on level to the emission control lines during the first initialization period P1 and the second initialization period P2. Here, the turn-on level is a voltage level of the emission control signal EM to turn on the transistor to which the emission control signal EM is applied. Accordingly, the anode electrode of the organic light emitting diode of and the gate voltage of the driving transistor of all the pixels PX may be initialized to a certain voltage level. In some example embodiments, the emission controller 124 may sequentially provide the emission control signal EM having the turn-on level to the emission control liens corresponding to the pixel rows during the emission period P5.

The power supply 125 may provide the first power voltage ELVDD and the second power voltage ELVSS to the display panel 110. The first power voltage ELVDD may have one of a first voltage level and a second voltage level. In some example embodiments, the second voltage level may less than the first voltage level. In some example embodiments, the power supply 125 may provide the first power voltage ELVDD having the second voltage level during the first initialization period P1 and the second initialization period P2 and provide the first power voltage ELVDD having the first voltage level during the threshold voltage compensation period P3, the writing period P4, and the emission period P5 when the driving transistor is the p-channel metal oxide semiconductor transistor. Accordingly, the first power voltage ELVDD may have less voltage level than the second power voltage ELVSS in the first initialization period P1 and the second initialization period P2, so that unintended emission of the organic light emitting diode due to current leakage at the driving transistor and/or an increase of an anode voltage of the organic light emitting diode may be prevented. The second voltage level may be a less level than the second power voltage ELVSS. Further, the second transistor and third transistor may turn off and the driving transistor and the organic light emitting diode may not be connected in the threshold compensation period P3 and the writing period P4, so that the emission may be prevented although the first power voltage ELVDD have the first voltage level.

The second power voltage ELVSS may have a predetermined constant voltage level. That is, the second power voltage ELVSS have a direct current (DC) voltage. For example, the second power voltage ELVSS may be a ground voltage or a predetermined negative voltage.

In the first initialization period P1, the first power voltage ELVDD may have the second voltage level, and the initialization control signal GC and the emission control signal EM may have the turn-on level. Thus, the anode voltage of the organic light emitting diode may be initialized to the first power voltage ELVDD having the second voltage level.

In the second initialization period P2, the first power voltage ELVDD may have the second voltage level, and the scan signal GW, the initialization control signal GC, and the emission control signal EM may have the turn-on level. Thus, the gate voltage of the driving transistor and the anode voltage of the organic light emitting diode in each of the pixels PX may be initialized to a sum of the first power voltage ELVDD having the second voltage level and the threshold voltage of the driving transistor.

In the threshold voltage compensation period P3, the first power voltage ELVDD may have the first voltage level, and the scan signal GW and the initialization control signal GC may have the turn-on level. Thus, the gate voltage of the driving transistor and the anode voltage of the organic light emitting diode in each of the pixels PX may be compensated with a sum of the first power voltage ELVDD having the first voltage level and the threshold voltage of the driving transistor.

In the writing period P4, the first power voltage ELVDD may have the first voltage level, and the scan signal having the turn-on level may be sequentially provided to the scan lines in order of pixel rows. Thus, the data voltage DATA may be sequentially written on the pixel row through the data lines.

In the emission period P5, the first power voltage ELVDD may have the first voltage level, and the emission control signal EM having the turn-on level may be sequentially provided to the emission control lines in order of the pixel rows. Thus, the pixels PX may sequentially emit light based on the respective data voltages DATA in order of the pixel row.

As described above, the organic light emitting display device 100 according to some example embodiments may perform the progressive emission method that sequentially emits the pixels PX having 4T2C (4 transistors and 2 capacitors) pixel structure. The pixels PX may block the path of the leakage current at the driving transistor during the writing period P4 and perform the sequentially emission during the emission period P5, so that a change of the driving current of the driving transistor due to the current leakage at the driving transistor and/or the change of the data voltage DATA may be prevented or reduced.

Figure 3:
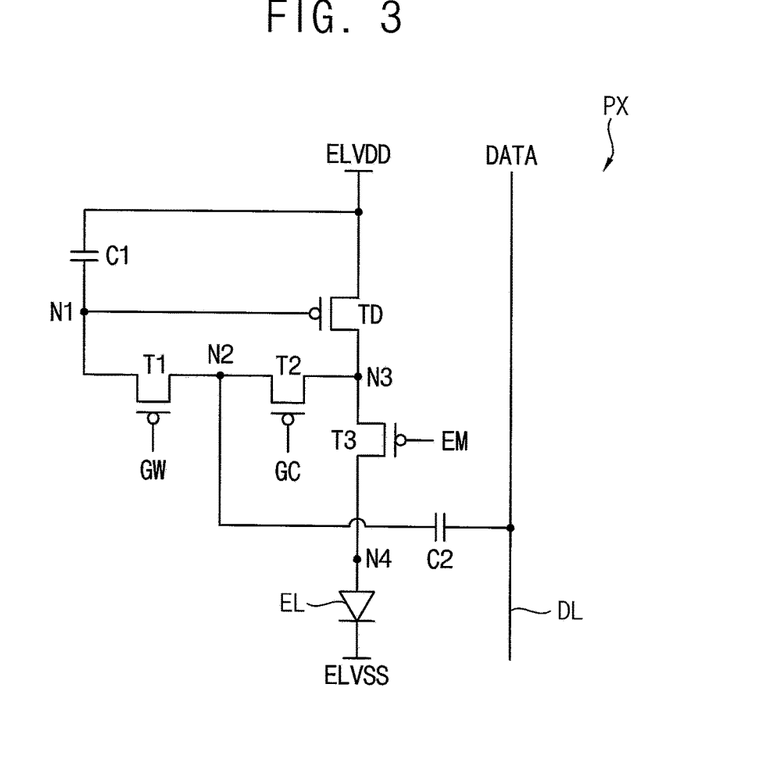
FIG. 3 is a circuit diagram illustrating an example of a pixel included in the organic light emitting display device of FIG. 1.

FIG. 3 is a circuit diagram illustrating an example of a pixel included in the organic light emitting display device of FIG. 1.

Referring to FIG. 3, the pixel PX may include a first transistor T1, a second transistor T2, a third transistor T3, a driving transistor TD, a first capacitor C1, a second capacitor C2, and an organic light emitting diode EL. In some example embodiments, the pixel PX may be included in the organic light emitting display device that is driven in the progressive emission method.

The first transistor T1 may be connected between a first node N1 and a second node N2. The first transistor T1 may include the gate electrode configured to receive the scan signal GW. The first transistor T1 may include a first electrode, the gate electrode, and a second electrode. In some embodiments, the first electrode of the first transistor T1 may correspond to the first node N1, the second electrode of the first transistor T2 may correspond to the second node N2, and the gate electrode may be connected with the scan line. The first transistor T1 may turn on in response to the scan signal GW having the turn-on level. The first node N1 and the second node N2 may be electrically coupled when the first transistor T1 turns on. The first transistor T1 may turn on in the second initialization period P2 and the threshold voltage compensation period P3 and may electrically couple the gate electrode (e.g., the first node N1) and the second electrode of the driving transistor TD. Further, the first transistor T1 may turn on in the writing period P4 and transfer the data voltage DATA to the gate electrode of the driving transistor TD.

The second transistor T2 may be connected to the first transistor T1 in series. The second transistor T2 may be connected between the second node N2 and third node N3. The second transistor may include the gate electrode configured to receive the initialization control signal GC. The second transistor T2 may include a first electrode, the gate electrode, and a second electrode. In some example embodiments, the first electrode of the second transistor T2 may correspond to the second node N2 the second electrode of the second transistor T2 may correspond to the third nod eN3, and the gate electrode of the second transistor T2 may be connected with the initialization control line. The second transistor T2 may turn on in response to the initialization signal GC having the turn-on level. The second node N2 and the third node N3 may be electrically coupled when the second transistor T2 turns on. The second transistor T2 may turn on in the first initialization period P1 and electrically couple an anode electrode of the organic light emitting diode EL and the data line DL. The second transistor T2 may turn on in the second initialization period P2 and the threshold voltage compensation period P3 and electrically couple the gate electrode (e.g., the first node N1) and the second electrode of the driving transistor with the first transistor T1.

The third transistor T3 may be connected between the third node N3 and the fourth node N4. The third transistor T3 may include a gate electrode configured to receive the gate electrode. The third transistor T3 may include a first electrode, the gate electrode, and a second electrode. The first electrode of the third transistor T3 may correspond to a fourth node N4, the second electrode of the third transistor T3 may correspond to the third node N3, and the gate electrode may be coupled to the emission control line. The third transistor may turn on in response to the emission control signal EM having the turn-on level. The fourth node N4 (e.g., the anode electrode of the organic light emitting diode EL) and the third node N3 may be electrically coupled when the third transistor T3 turns on. The third transistor may turn on in the first initialization period P1 and the second initialization period P2 and transfer a voltage of the third node N3 to the fourth node N4 (e.g., the anode electrode of the organic light emitting diode EL).

The driving transistor TD may be connected between the first power voltage providing line and the third node N3. The driving transistor TD may include a gate electrode connected to the first node N1 and control the driving current. The driving transistor may include a first electrode, the gate electrode, and a second electrode. For example, the first electrode may be a drain electrode and the second electrode may be a source electrode. In some example embodiments, the gate electrode of the driving transistor TD may correspond to the first node N1, the second electrode may correspond to the third node N3. An emission luminance of the organic light emitting diode EL may be determined by the driving current flowing through the driving transistor TD.

The first capacitor C1 may be connected between the first power voltage providing line and the first node N1. The second capacitor C2 may be connected between the second node N2 and the data line DL. A gate voltage of the driving transistor TD may be determined in the writing period P4 by the voltage stored in the first and the second capacitor C1 and C2.

The organic light emitting diode EL may be connected between the fourth node N4 and the second power voltage providing line. The organic light emitting diode EL may emit light based on the driving current. In some example embodiments, the anode electrode of the third node N3 may correspond to the anode electrode of the organic light emitting diode EL.

The pixel PX that includes the first transistor T1, the second transistor T2, the third transistor T3, and the driving transistor TD implemented as p-channel metal oxide semiconductor (PMOS) transistors is described in FIG. 3, the first transistor T1, the second transistor T2, the third transistor T3, and the driving transistor TD of the pixel PX is not limited thereto. In some example embodiments, the first transistor T1, the second transistor T2, the third transistor T3, and the driving transistor TD may be implemented as an n-channel metal oxide semiconductor (NMOS) transistors. Alternatively, the first transistor T1, the second transistor T2, the third transistor T3, and the driving transistor TD may be implemented as a low temperature poly silicon (LTPS) thin film transistor, a oxide thin film transistor, or/and a low temperature polycrystalline oxide (LTPO) thin film transistor.

Figure 4:
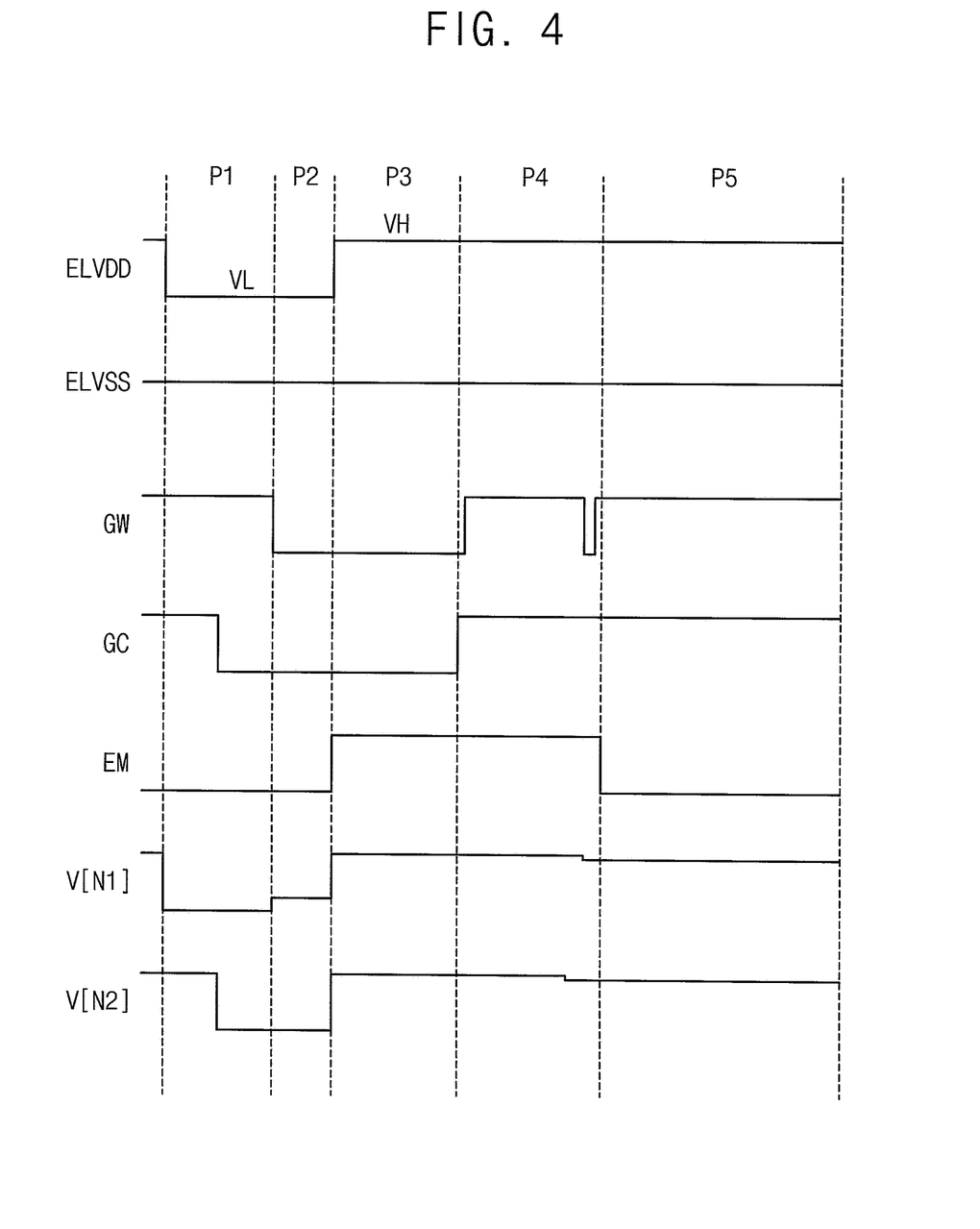
FIG. 4 is a timing diagram illustrating an example of the operation of the pixel of FIG. 3.
Figure 5A:
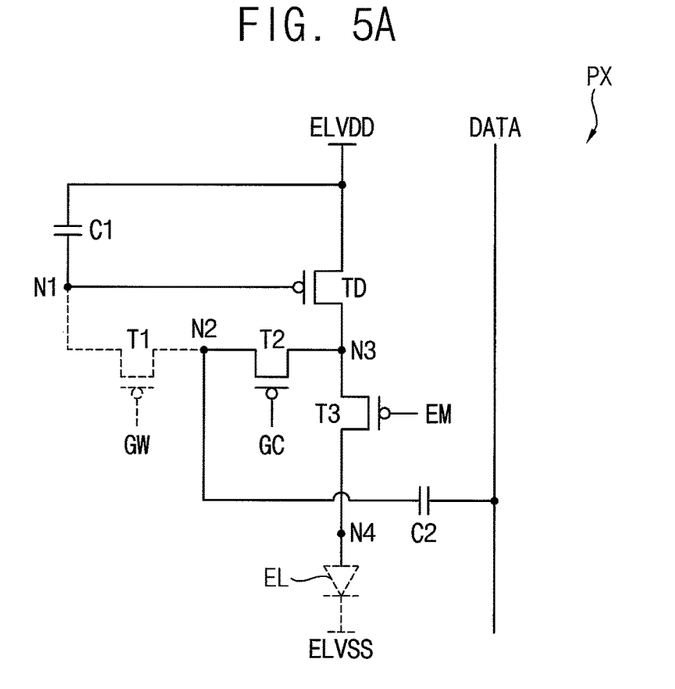
FIGS. 5A and 5E are circuit diagrams illustrating for an operation of the pixel of FIG. 3.
Figure 5B:
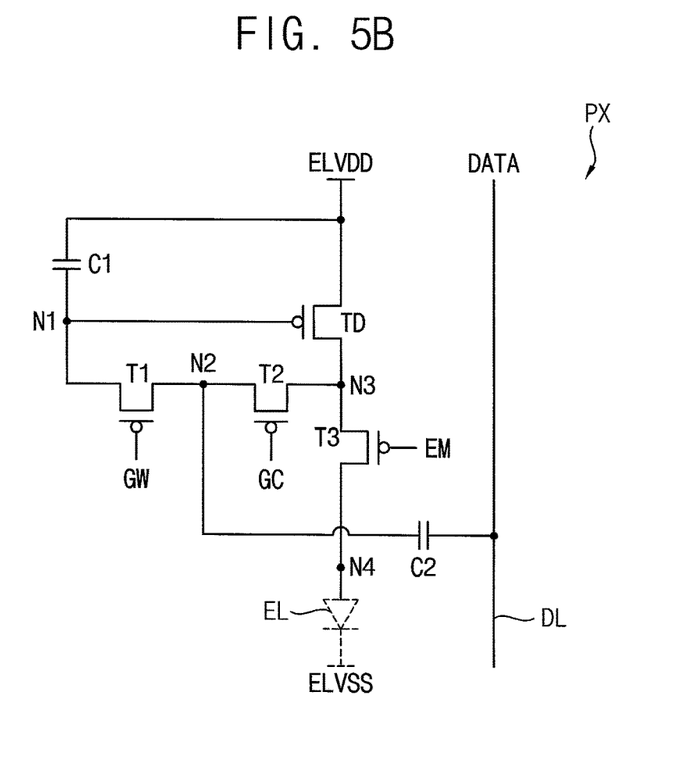
Figure 5C:
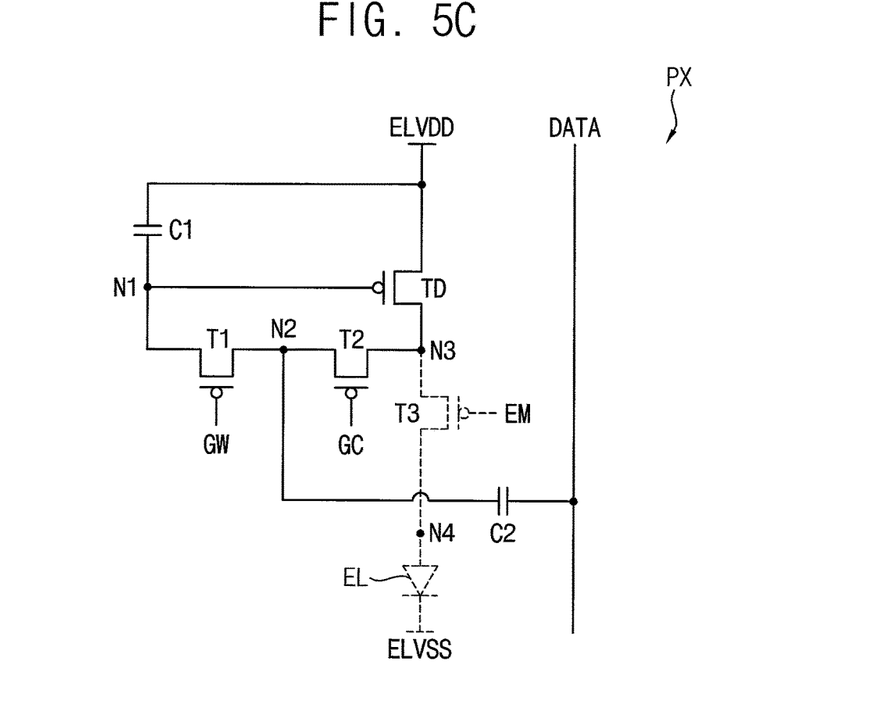
Figure 5D:
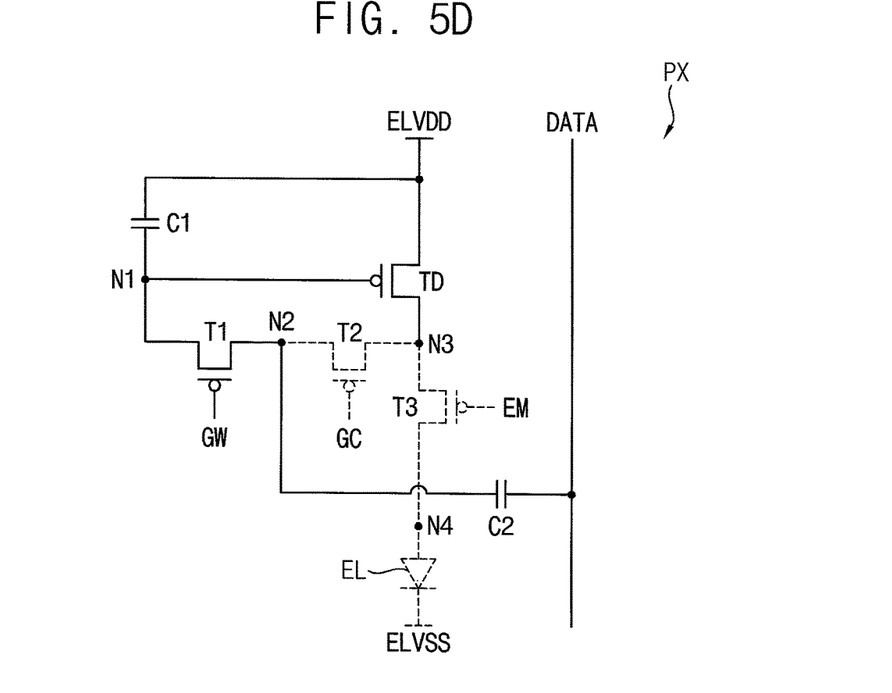
Figure 5E:
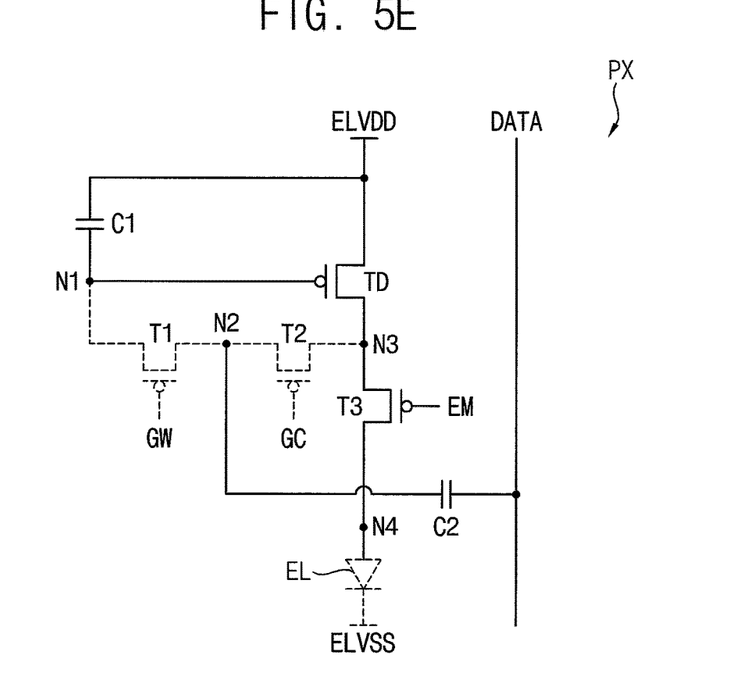

FIG. 4 is a timing diagram illustrating an example of the operation of the pixel of FIG. 3 and FIGS. 5A and 5E are circuit diagrams illustrating for an operation of the pixel of FIG. 3.

Referring to FIG. 4, a frame period may include a first initialization period P1, a second initialization period P2, a threshold voltage compensation period P3, a writing period P3, and an emission period P5.

Referring to FIGS. 4 and 5A, in the first initialization period P1, the first power voltage ELVDD may have the second voltage level VL, the initialization control signal GC and the emission control signal EM may have the turn-on level, and the scan signal GW may have the turn-off level. Accordingly, the second transistor T2 may turn on and the second node N2 and the third node N3 may be connected. The third transistor T3 may turn on and the third node N3 and the fourth node N4 may be connected. Therefore, the second node N2, the third node N3, and the fourth node N3 may have the second voltage level VL. That is, the anode electrode of the organic light emitting diode EL may be initialized to the first power voltage ELVDD having the second voltage level VL. Here, a residue voltage due to an emission in a previous frame may remain in the first node N1 (i.e., the gate voltage of the driving transistor TD).

Referring to FIGS. 4 and 5B, in the second initialization period P2, the first power voltage ELVDD may have the second voltage level VL, and the scan signal GW, the initialization control signal and the emission control signal EM may have the turn-on level. Accordingly, the first transistor T1 may turn on and the first node N1 and the second node N2 may be connected. The second transistor T2 may turn on and the second node N2 and the third node N3 may be connected. The third transistor T3 may turn on and the third node N3 and the fourth node N4 may be connected. The gate electrode and the source electrode (e.g., the second electrode) of the driving transistor TD may be connected as the first node N1, the second node N2, and the third node N3 are connected. That is, the driving transistor TD may be diode-connected. The voltage of the first node N1, the voltage of the second node N2, and the voltage of the third node N3 may be have a value corresponding to a sum of the second voltage level VL and the threshold voltage of the driving transistor TD (e.g., represented as VL+Vth). That is, the anode voltage of the organic light emitting diode EL and the gate voltage of the driving transistor TD may be initialized to the VL+Vth.

Referring to FIGS. 4 and 5C, in the threshold voltage compensation period P3, the first power voltage ELVDD may have the first voltage level VH, the scan signal GW, the initialization control signal GC may have the turn-on level, and the emission control signal EM may have the turn-off level. Accordingly, the first transistor T1 may turn on and the first node N1 and the second node N2 may be connected. The second transistor T2 may turn on and the second node N2 and the third node N3 may be connected. Thus, the driving transistor TD may maintain the diode-connected state, and the voltage of the first node N1, the voltage of the second node N2, and the voltage of the third node N3 may be changed to the sum of the first voltage level VH and the threshold voltage of the driving transistor TD (i.e., VH+Vth). Therefore, the first capacitor C1 may store the threshold voltage of the driving transistor TD.

Referring to FIGS. 4 and 5D, in the writing period P4, the first power voltage ELVDD may have the first voltage level VH, the scan signal GW may have the turn-on level, and the initialization control signal GC and the emission control signal EM may have the turn-off level. Accordingly, the first transistor T1 may turn on and the first node N1 and the second node N2 may be connected when the data voltage is written. Thus, the data voltage DATA provided through the data line DL may be stored in the first capacitor C1 and the second capacitor C2. The first capacitor C1 and the second capacitor C2 may store the data voltage DATA by charge sharing based on a capacitance ratio of the first capacitor C1 and the second capacitor C2. The data voltage DATA to which the threshold voltage is compensated may be stored in the first capacitor C1 during the writing period P4 because the threshold voltage is stored in the first capacitor C1 during the threshold voltage compensation period P3. A wiring time of the pixel row may be different from each other because the data voltage DATA is written in a row-by-row during the writing period P4. The pixel PX of the organic light emitting display device according to example embodiments may prevent a fluctuation of the anode voltage of the organic light emitting diode EL due to the leakage current of the driving transistor TD by turning off the second transistor T2 and the third transistor T3 during the writing period P4. Thus, the display defect such as luminance unevenness due to the leakage current may be improved or prevented.

Referring to FIGS. 4 and 5E, in the emission period P5, the first power voltage ELVDD may have the first voltage level VH, the emission control signal EM may have the turn-on level, and the scan signal GW and the initialization control signal GC may have the turn-off level. Accordingly, the third transistor may turn on and the third node N3 and the fourth node N4 may be connected. Thus, the driving current generated based on the data voltage DATA may flow to the anode electrode of the organic light emitting diode EL through the third transistor T3. The organic light emitting diode EL may emit light in the luminance corresponding to the data voltage DATA. In case that the organic light emitting display device driven in the simultaneous emission method, the data voltage DATA stored in the capacitor may be changed because the times from the writing period P5 to the emission period P6 are different in order of pixel rows. Thus, in case that the organic light emitting display device driven in the simultaneous emission method, the anode voltage of the organic light emitting diode EL may be changed due to the fluctuation of the data voltage DATA stored in the capacitor or the leakage of the driving transistor TD. However, the organic light emitting display device according to example embodiments may be driven in the progressive emission method that sequentially emit the pixels in the row-by-row as the data voltage DATA is written to the pixel PX, so that the change of the anode voltage of the organic light emitting diode EL due to the fluctuation of the data voltage DATA or the leakage current of the driving transistor TD may be prevented.

As described above, the pixel PX and the organic light emitting display device according to some example embodiments may separate the first node N1 and the third node N3 in the writing period P4 by connecting the first transistor T1 controlled by the scan signal GW and the second transistor T2 controlled by the initialization control signal GC in series. Further, the pixel PX and the organic light emitting display device according to example embodiments may use the progressive emission method by including the third transistor T3 connected between the driving transistor TD and the organic light emitting diode EL and controlled by the emission control signal. Thus, the leakage current from the driving transistor TD to the organic light emitting diode EL may be prevented in the writing period P4.

Figure 6:
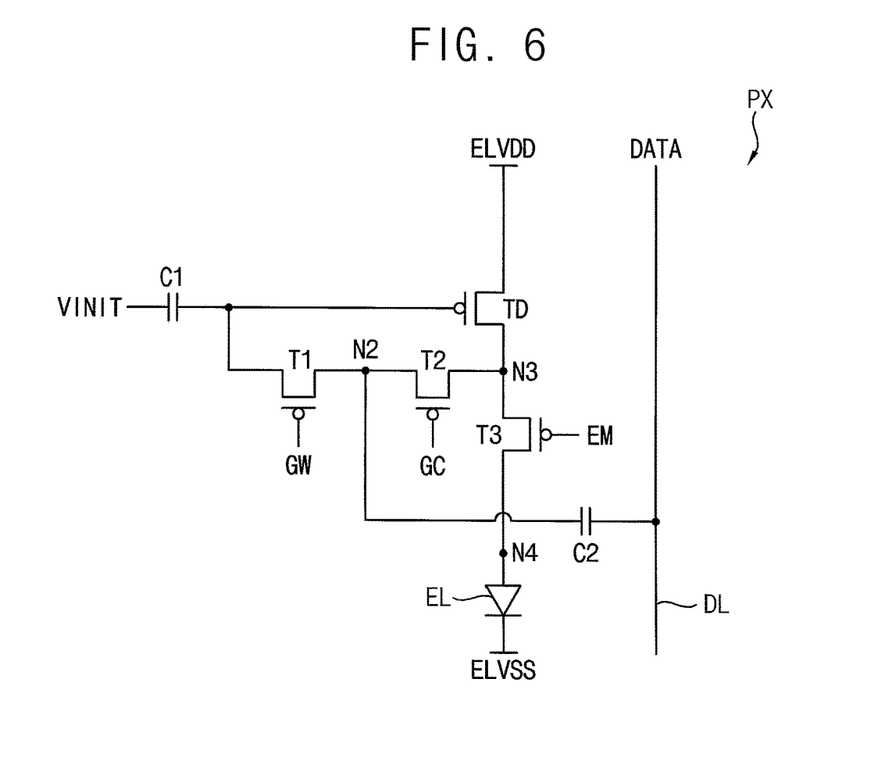
FIG. 6 is a circuit diagram illustrating other example of the pixel included in the organic light emitting display device of FIG. 1.

FIG. 6 is a circuit diagram illustrating another example of the pixel included in the organic light emitting display device of FIG. 1.

Referring to FIG. 6, a pixel PX may include a first transistor T1, a second transistor T2, a third transistor T3, a driving transistor TD, a first capacitor C1, a second capacitor C2, and an organic light emitting diode EL.

The pixel PX in which the first capacitor C1 is connected to the first power voltage providing line is described in FIG. 3, the pixel PX of FIG. 6 may include the first capacitor C1 connected with an initialization voltage providing line. The anode electrode of the organic light emitting diode EL and the gate electrode of the driving transistor TD may be initialized to the initialization voltage provided through the initialization voltage providing line.

Figure 7:
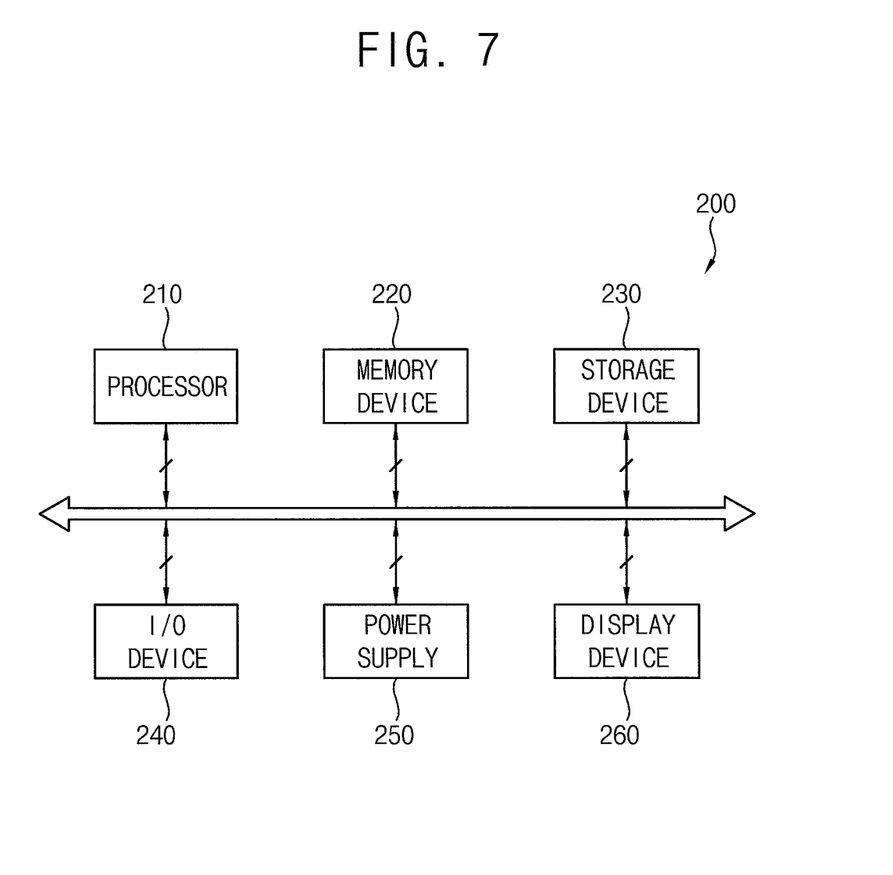
FIG. 7 is a block diagram illustrating an electronic device that includes the organic light emitting display device of FIG. 1.
Figure 8:
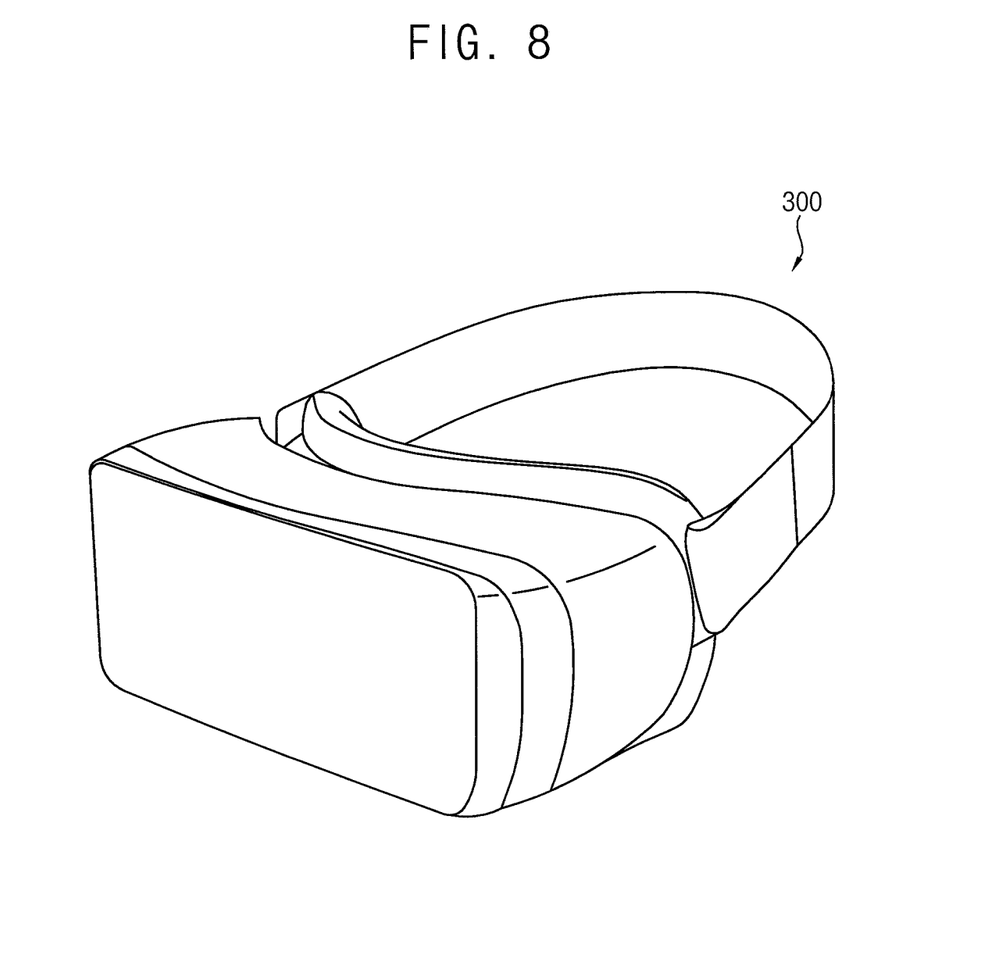
FIG. 8 is a diagram illustrating an example of the electronic device of FIG. 7 implemented in a head mount display.

FIG. 7 is a block diagram illustrating an electronic device that includes the organic light emitting display device of FIG. 1 and FIG. 8 is a diagram illustrating an example of the electronic device of FIG. 7 implemented in a head mount display.

Referring to FIGS. 7 and 8, an electronic device 200 may include a processor 210, a memory device 220, a storage device 230, an input/output ("I/O") device 240, a power device 250, and a display device 260. Here, the display device 260 may correspond to the display device 100 of FIG. 1. In addition, the electronic device 200 may further include a plurality of ports for communicating a video card, a sound card, a memory card, a universal serial bus ("USB") device, other electronic device, etc. Although it is illustrated in FIGS. 7 and 8 that the electronic device 200 is implemented as a head mount display 300, a kind of the electronic device 200 is not limited thereto.

The processor 210 may perform various computing functions. In an exemplary embodiment, the processor 210 may be a micro processor, a central processing unit ("CPU"), etc. In an exemplary embodiment, the processor 210 may be coupled to other components via an address bus, a control bus, a data bus, etc. In an exemplary embodiment, the processor 210 may be coupled to an extended bus such as surrounded component interconnect ("PCI") bus, for example. The memory device 220 may store data for operations of the electronic device 200. In an exemplary embodiment, the memory device 220 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or at least one volatile memory device such as a dynamic random access memory ("DRAM") device, a static random access memory ("SRAM") device, a mobile DRAM device, etc., for example. The storage device 230 may be a solid stage drive ("SSD") device, a hard disk drive ("HDD") device, a CD-ROM device, etc.

The I/O device 240 may be an input device such as a keyboard, a keypad, a touchpad, a touch-screen, a mouse, etc., and an output device such as a printer, a speaker, etc. In some exemplary embodiments, the display device 260 may be included in the I/O device 240. The power device 250 may provide a power for operations of the electronic device 200. The display device 260 may communicate with other components via the buses or other communication links. According to some example embodiments, the display device 260 may be included in the I/O device 240.

As described above, the display device 260 may include a display panel and a panel driver. The display panel may include a plurality of pixels. The display panel may include a plurality of scan lines, a plurality of data lines, a plurality of first power voltage providing lines, a plurality of second power voltage providing lines, a plurality of initialization control lines, and a plurality of emission control lines. Each of the pixels may include a first transistor connected between a first node and a second node and having a gate electrode configured to receive a scan signal, a second transistor connected between the second node and a third node in series with the first transistor and having a gate electrode configured to receive an initialization control signal, a driving transistor connected between the first power voltage providing line and the third node and having a gate electrode connected to the first node to control a driving current, a third transistor connected between the third node and the fourth node and having a gate electrode configured to receive the emission control signal, the organic light emitting diode connected between the fourth node and the second power voltage providing line to emit light based on the driving current, a first capacitor connected between the first power voltage providing line and the first node, and the second capacitor connected between the first capacitor and the second node. The display device may be driven in a first initialization period during which the second node and the fourth node are initialized, a second initialization period during which a gate voltage of the driving transistor is initialized, a threshold voltage compensation period during which a threshold voltage of the driving transistor is compensated, a writing period during which data voltages are sequentially written in the pixels, and an emission period during which the pixels are sequentially emit light in a frame period.

As described above, the pixel of the display device 260 included in the electronic device 200 may include the first and second transistors connected in series and the third transistor connected between the driving transistor and the organic light emitting diode to be controlled by the emission control signal, so that the driving transistor and the organic light emitting diode may be electrically separated during the writing period. Further, the third transistors of the pixels may sequentially turn on and the driving current may flow through the organic light emitting diode during the emission period, so that the display device 260 may perform the progressive emission method. Thus, the display defect such as the luminance unevenness between pixels may be prevented by preventing the fluctuation of the anode voltage of the organic light emitting diode due to the leakage current of the driving transistor.

The present embodiments may be applied to any display device and any system including the display device. For example, the present embodiments may be applied to a HMD device, a television, a computer monitor, a laptop, a digital camera, a cellular phone, a smart phone, a smart pad, a personal digital assistant (PDA), a portable multimedia player (PMP), a MP3 player, a navigation system, a game console, a video phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. An organic light emitting display device comprising:
    a display panel including a plurality of pixels, a plurality of scan lines, a plurality of data lines, a first power voltage providing line, a second power voltage providing line, a plurality of initialization control lines, an emission control lines; and
    a panel driver configured to provide a scan signal, a data voltage, a first power voltage, a second power voltage, an initialization control signal, and an emission control signal to drive the pixels,
    wherein each of the pixels includes:
    a first transistor connected between a first node and a second node and having a gate electrode to receive the scan signal;
    a second transistor connected between the second node and a third node in series with the first transistor and having a gate electrode to receive the initialization control signal;
    a driving transistor connected between the first power voltage providing line and the third node and having a gate electrode connected to the first node to control a driving current;
    a third transistor connected between the third node and a fourth node and having a gate electrode to receive the emission control signal;
    an organic light emitting diode, connected between the fourth node and the second power voltage providing line, to emit light based on the driving current;
    a first capacitor connected between the first power voltage providing line and the first node; and
    a second capacitor connected between the second node and one of the data lines,
    wherein the display panel is to be driven in a frame which includes:
    a first initialization period to initialize the second node and the fourth node,
    a second initialization period after the first initialization period to initialize a gate voltage of the driving transistor.

2. The organic light emitting display device of claim 1, wherein the display panel is to be driven in the frame which further includes:
 a threshold voltage compensation period after the second initialization period to compensate a threshold voltage of the driving transistor,
 a writing period after the threshold voltage compensation period to sequentially write data voltages, and
 an emission period after the writing period in which the pixels are to sequentially emit light.

3. The organic light emitting display device of claim 1, wherein the driving transistor, the first transistor, the second transistor, and the third transistor are p-channel metal oxide semiconductor (PMOS) transistors.

4. The organic light emitting display device of claim 2, wherein the first power voltage has one of a first voltage level and a second voltage level less than the first voltage level, and
 wherein the second power voltage has a constant voltage level.

5. The organic light emitting display device of claim 4, wherein the first power voltage has the second voltage level, the initialization control signal has a turn-on level, and the emission control signal has a turn-on level in the first initialization period.

6. The organic light emitting display device of claim 4, wherein the first power voltage has the second voltage level, the scan signal has a turn-on level, the initialization control signal has a turn-on level, and the emission control signal has a turn-on level in the second initialization period.

7. The organic light emitting display device of claim 4, wherein the first power voltage has the first voltage level, the scan signal has a turn-on level, and the initialization control signal has a turn-on level in the threshold voltage compensation period.

8. The organic light emitting display device of claim 4, wherein the first power voltage has the first voltage level, and the scan signal having a turn-on level is sequentially provided to the scan lines in order of pixel rows in the writing period.

9. The organic light emitting display device of claim 4, wherein the first power voltage has the first voltage level, and the emission control signal having a turn-on level is sequentially provided to the emission control lines in order of pixel rows in the emission period.

10. The organic light display device of claim 1, wherein the driving transistor, the first transistor, the second transistor, and the third transistor are n-channel metal oxide semiconductor (NMOS) transistors.

11. A pixel of an organic light emitting display device comprising:
 a first transistor connected between a first node and a second node and having a gate electrode to receive a scan signal;
 a second transistor connected between the second node and a third node in series with the first transistor and having a gate electrode to receive an initialization control signal;
 a driving transistor connected between a first power voltage providing line and the third node and having a gate electrode connected to the first node to control a driving current;
 a third transistor connected between the third node and a fourth node and having a gate electrode to receive an emission control signal;
 an organic light emitting diode connected between the fourth node and a second power voltage providing line to emit light based on the driving current;
 a first capacitor connected between the first power voltage providing line and the first node; and
 a second capacitor connected between the second node and one of data lines,
 wherein the display device is to be driven in a frame which includes:
 a first initialization period to initialize the second node and the fourth node,
 a second initialization period after the first initialization period to initialize a driving voltage of the driving transistor.

12. The pixel of claim 11, wherein the display device is to be driven in the frame which further includes:
 a threshold voltage compensation period after the second initialization period to compensate a threshold voltage of the driving transistor,
 a writing period after the threshold voltage compensation period to sequentially write data voltages, and
 an emission period after the writing period in which the pixels are to sequentially emit light.

13. The pixel of claim 12, wherein the first power voltage has one of a first voltage level and a second voltage level less than the first voltage level, and
 wherein the second power voltage has a constant voltage level.

14. The pixel of claim 13, wherein the first power voltage has the second voltage level, the initialization control signal has a turn-on level, and the emission control signal has a turn-on level in the first initialization period.

15. The pixel of claim 13, wherein the first power voltage has the second voltage level, the scan signal has a turn-on level, the initialization control signal has a turn-on level, and the emission control signal has a turn-on level in the second initialization period.

16. The pixel of claim 13, wherein the first power voltage has the first voltage level, the scan signal has a turn-on level, and the initialization control signal has a turn-on level in the threshold voltage compensation period.

17. The pixel of claim 13, wherein the first power voltage has the first voltage level, and the scan signal having a turn-on level is sequentially provided to the scan lines in order of pixel row in the writing period.

18. The pixel of claim 13, wherein the first power voltage has the first voltage level, and the emission control signal having a turn-on level is sequentially provided to the emission control lines in order of pixel rows in the emission period.

19. The pixel of claim 11, wherein the driving transistor, the first transistor, the second transistor, and the third transistor are p-channel metal oxide semiconductor (PMOS) transistors.

20. The pixel of claim 11, wherein the driving transistor, the first transistor, the second transistor, and the third transistor are n-channel metal oxide semiconductor (NMOS) transistors.

* * * * *